(12) United States Patent
Wang

(10) Patent No.: US 8,654,490 B2
(45) Date of Patent: Feb. 18, 2014

(54) HIGH VOLTAGE ELECTROSTATIC DISCHARGE CLAMP USING DEEP SUBMICRON CMOS TECHNOLOGY

(75) Inventor: Dejun Wang, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 66 days.

(21) Appl. No.: 13/398,638

(22) Filed: Feb. 16, 2012

(65) Prior Publication Data

US 2013/0215540 A1    Aug. 22, 2013

(51) Int. Cl.
*H02H 9/00* (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS

| | | | |
|---|---|---|---|
| 5,568,345 A * | 10/1996 | Mudd et al. ..................... | 361/56 |
| 5,956,219 A * | 9/1999 | Maloney ........................ | 361/56 |
| 6,803,680 B2 * | 10/2004 | Brindle et al. ................ | 307/115 |
| 8,059,376 B2 | 11/2011 | Chen et al. | |
| 8,064,175 B2 * | 11/2011 | Poulton .......................... | 361/56 |
| 2005/0237681 A1 * | 10/2005 | Chen .............................. | 361/56 |
| 2010/0225347 A1 * | 9/2010 | Worley et al. ................. | 324/765 |
| 2010/0254051 A1 * | 10/2010 | Jeon et al. ..................... | 361/56 |
| 2011/0260773 A1 * | 10/2011 | Granger-Jones et al. ..... | 327/427 |
| 2012/0007648 A1 * | 1/2012 | Vashchenko .................. | 327/321 |

\* cited by examiner

*Primary Examiner* — Rexford Barnie
*Assistant Examiner* — Ann Hoang
(74) *Attorney, Agent, or Firm* — Rahman LLC

(57) ABSTRACT

An ESD circuit includes a plurality of MOS devices arranged in a stack, wherein each of the MOS devices comprises a source, a drain, and a gate; a voltage source inputting a supply voltage to the stack of MOS devices; a first plurality of resistors dividing the supply voltage to each source and each drain of the MOS devices in the stack; a second plurality of resistors biasing the supply voltage to each gate of the MOS devices in the stack; an inverter device operatively connected to the second plurality of resistors; a time lag circuit that turns the inverter device on and off; and a plurality of capacitors pulling the voltage to each gate of the MOS devices in the stack to the supply voltage upon the inverter device turning off.

16 Claims, 4 Drawing Sheets

HIGH VOLTAGE ELECTROSTATIC DISCHARGE CLAMP USING DEEP SUBMICRON CMOS TECHNOLOGY

BACKGROUND

1. Technical Field

The embodiments herein generally relate to circuit design, and, more particularly, to electrostatic discharge (ESD) protection circuitry used in complementary metal-oxide-semiconductor (CMOS) technology.

2. Description of the Related Art

Protecting electric circuits and devices from ESD continues to be a problem in integrated circuit technology. ESD protection circuits and devices can be used to overcome ESD problems. Typical ESD protection circuitry, such as that described in U.S. Pat. No. 8,059,376 can generally handle a DC voltage up to 7.5v. However, there are certain market segments where a high voltage interface is needed and thus a special ESD protection technique is required. For example, a low noise block (LNB) controller should interface with a 19v DC supply from a cable setup box. Generally, this voltage far exceeds all conventional ESD breakdown limits. Moreover, due to the complexity of the 19v design, there are certain inherent start-up issues which the conventional ESD protection circuits that handle a DC voltage only up to 7.5v do not have to deal with and cannot deal with. Additionally, the conventional approach is to use a high voltage interface circuit, usually manufactured in a bipolar high voltage process, to regulate the voltage down to approximately 3-5 volts as the supply for the LNB controller. However, to minimize the cost of the total system solution, integrating the voltage regulation functionality onto the controller, which is typically manufactured in CMOS technology, is highly desirable.

A conventional ESD protection clamp is illustrated in FIG. 1. A clamp device (M_clamp) is connected between the supply and ground. A resistor/capacitor pair (R_clamp) forms a time lag apparatus to create a time lag when an ESD event occurs on the supply and creates a ground current return path to allow the ESD charge to flow from the supply to ground. This assumes a low and constant voltage level (e.g. up to 7.5v) on the effected device/circuit. However, when the DC voltage increases (e.g., over 7.5v), the ESD device runs the risks of breaking down if no protective measure is undertaken. Therefore, it is desirable to develop ESD protection circuitry that overcomes these challenges.

SUMMARY

In view of the foregoing, an embodiment herein provides an ESD circuit comprising a plurality of metal-oxide-semiconductor (MOS) devices arranged in a stack, wherein each of the MOS devices comprises a source, a drain, and a gate; a voltage source inputting a supply voltage to the stack of MOS devices; a first plurality of resistors dividing the supply voltage to each source and each drain of the MOS devices in the stack; a second plurality of resistors biasing the supply voltage to each gate of the MOS devices in the stack; an inverter device operatively connected to the second plurality of resistors; a time lag circuit that turns the inverter device on and off; and a plurality of capacitors pulling the voltage to each gate of the MOS devices in the stack to the supply voltage upon the inverter device turning off.

The ESD circuit may further comprise a diode that keeps a gate voltage of the inverter device higher than a turn-on threshold voltage of the stack of MOS devices. Each of the first plurality of resistors and the second plurality of resistors may comprise a resistor ladder. The time lag circuit may comprise a voltage divider connected in parallel with a capacitor. Preferably, the time lag circuit holds a voltage to a gate of the inverter device close to ground in order to turn off the inverter device. The stack of MOS devices preferably opens to form a ground return current path upon the inverter device turning off. A gate-to-source voltage of each of the MOS devices in the stack may be less than a turn-on threshold voltage of the MOS devices. Preferably, no leakage current flows through the stack of MOS devices during steady state. Preferably, the inverter device is temporarily turned off. Preferably, the stack of MOS devices is temporarily opened. The stack of MOS devices may comprise complementary metal-oxide-semiconductor (CMOS) thick oxide devices.

Another embodiment provides an ESD circuit comprising a stacked MOS device having a biasing structure and time lag circuit that provides current clamping during an ESD event and that is configured to handle DC voltage levels greater than ESD breakdown levels of a MOS device. The stacked MOS device may comprise a plurality of MOS devices each comprising a source, a drain, and a gate, and wherein the ESD circuit may further comprise means for providing a supply voltage to the stacked MOS device; a first plurality of resistors dividing the supply voltage to each source and each drain of the plurality of MOS devices; a second plurality of resistors biasing the supply voltage to each gate of the plurality of MOS devices; an inverter device operatively connected to the second plurality of resistors; a time lag circuit that turns the inverter device on and off; a plurality of capacitors pulling the voltage to each gate of the MOS devices in the stack to the supply voltage upon the inverter device turning off; and a diode that keeps a gate voltage of the inverter device higher than a turn-on threshold voltage of the stack of MOS devices.

Each of the first plurality of resistors and the second plurality of resistors may comprise a resistor ladder, and wherein the time lag circuit may comprise a voltage divider connected in parallel with a capacitor. The time lag circuit may hold a voltage to a gate of the inverter device close to ground in order to turn off the inverter device, and wherein the stack of MOS devices opens to form a ground return current path upon the inverter device turning off. A gate-to-source voltage of each MOS device in the stacked MOS device may be less than a turn-on threshold voltage of the MOS device, and wherein no leakage current flows through the stack of MOS devices during steady state. Preferably, the inverter device is temporarily turned off, and wherein the stack of MOS devices is temporarily opened. The stacked MOS device may comprise CMOS thick oxide devices.

Another embodiment provides a method of controlling ESD in a semiconductor structure, the method comprising providing a stack of MOS devices, wherein each of the MOS devices may comprise a source, a drain, and a gate; inputting a supply voltage to the stack of MOS devices; dividing the supply voltage to each source and each drain of the MOS devices in the stack; biasing the supply voltage to each gate of the MOS devices in the stack; clamping current through the semiconductor structure during an ESD event occurring in the semiconductor structure; and pulling voltage to each gate of the MOS devices in the stack to the supply voltage upon the biasing occurring, wherein no leakage current flows through the stack of MOS devices during steady state. The stack of MOS devices is preferably configured to handle DC voltage levels greater than ESD breakdown levels of the semiconductor structure.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
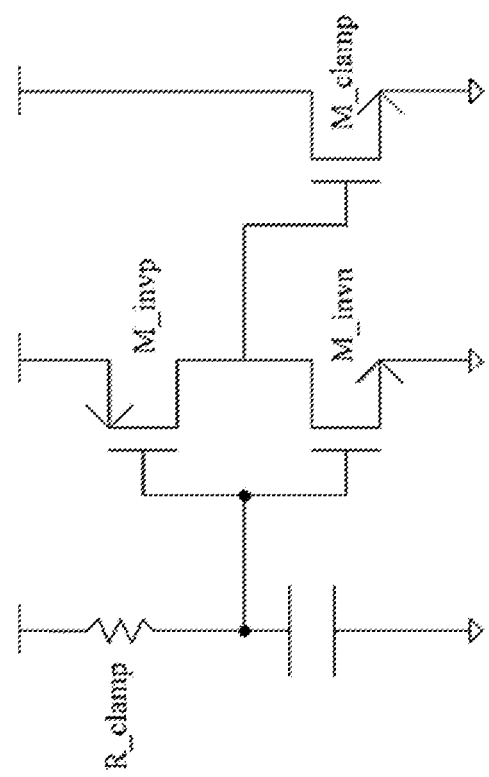
FIG. 1 is a circuit diagram illustrating a conventional ESD clamp structure.
Figure 2:
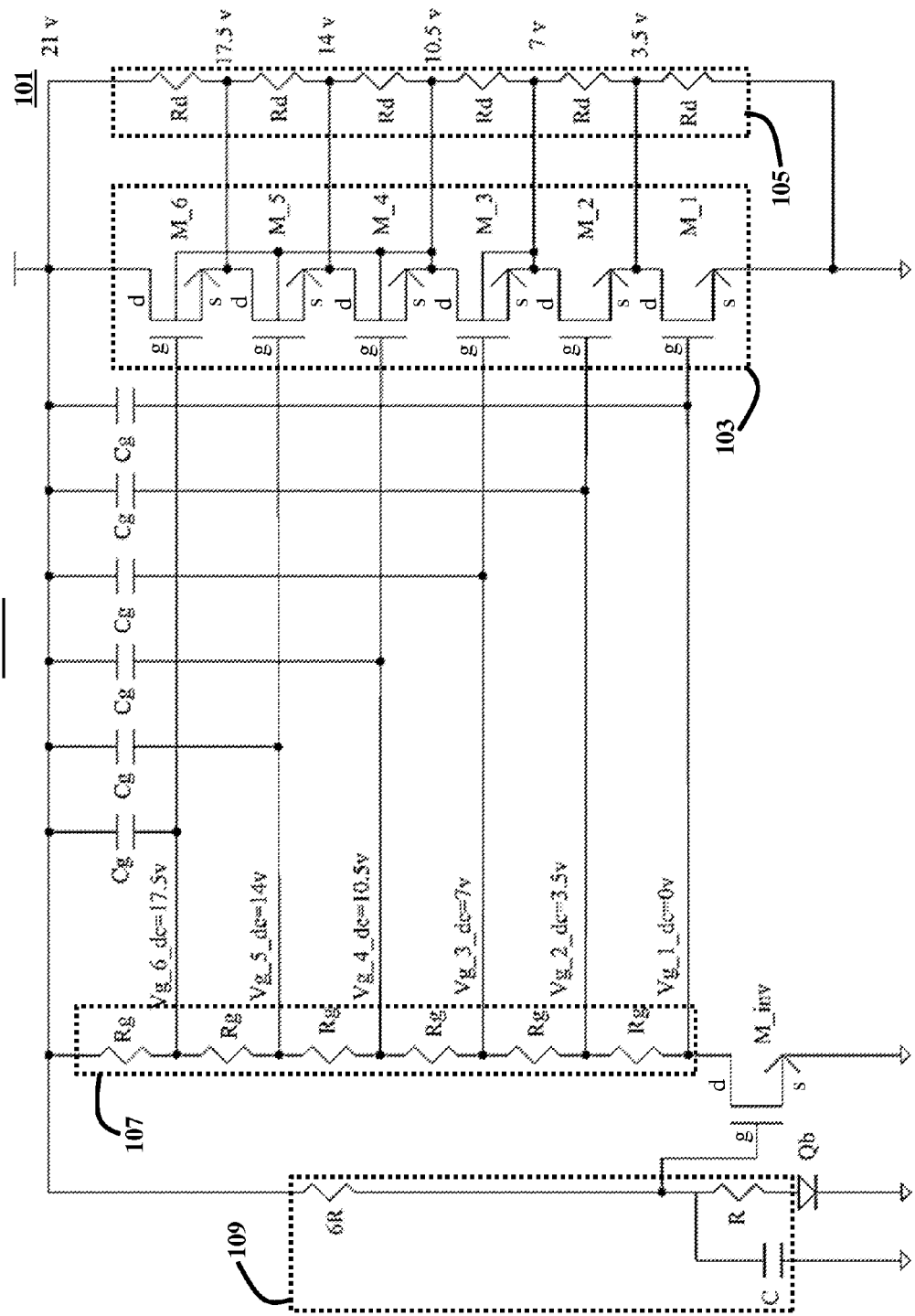
FIG. 2 is a circuit diagram illustrating a NMOS ESD clamp with a biasing structure and safeguard device according to an embodiment herein.
Figure 3:
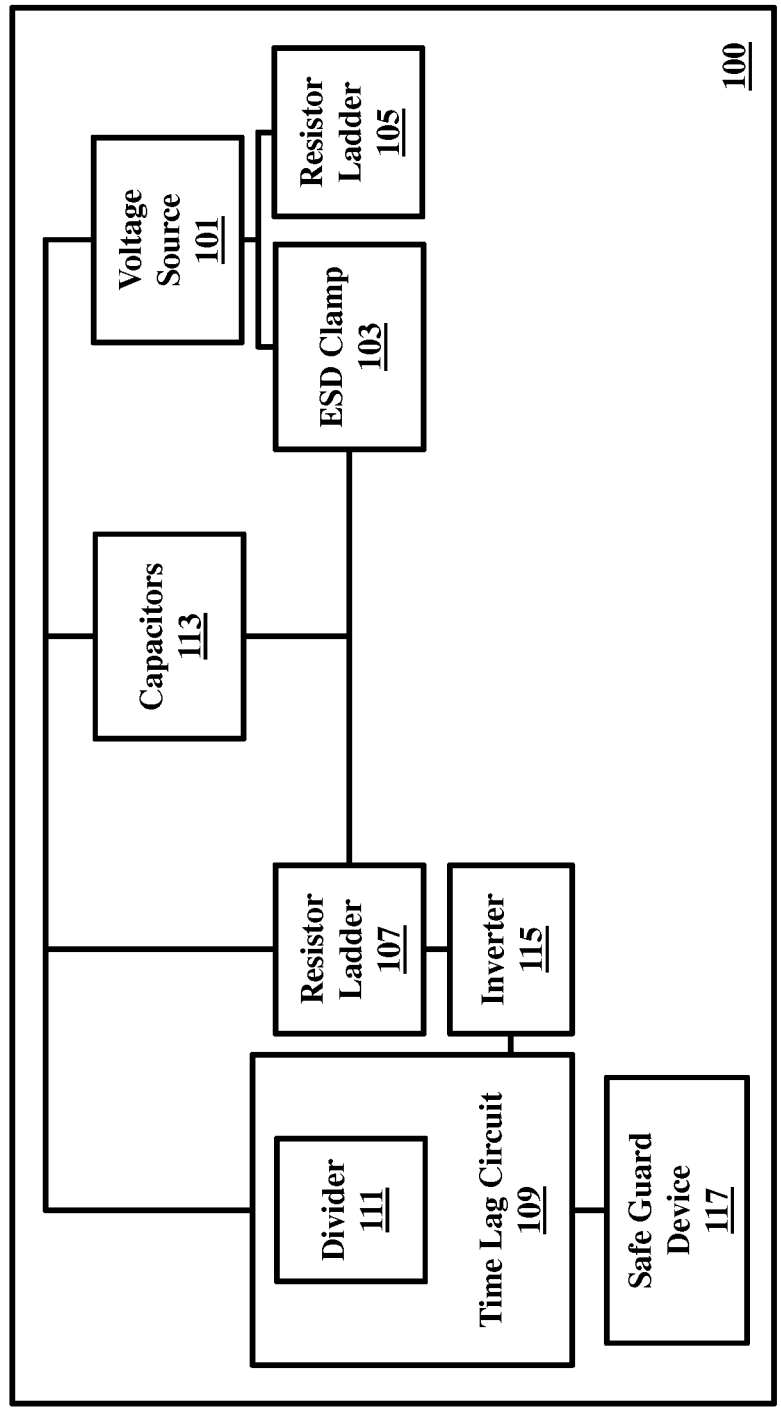
FIG. 3 is a system block diagram of the circuit of FIG. 2 according to an embodiment herein.
Figure 4:
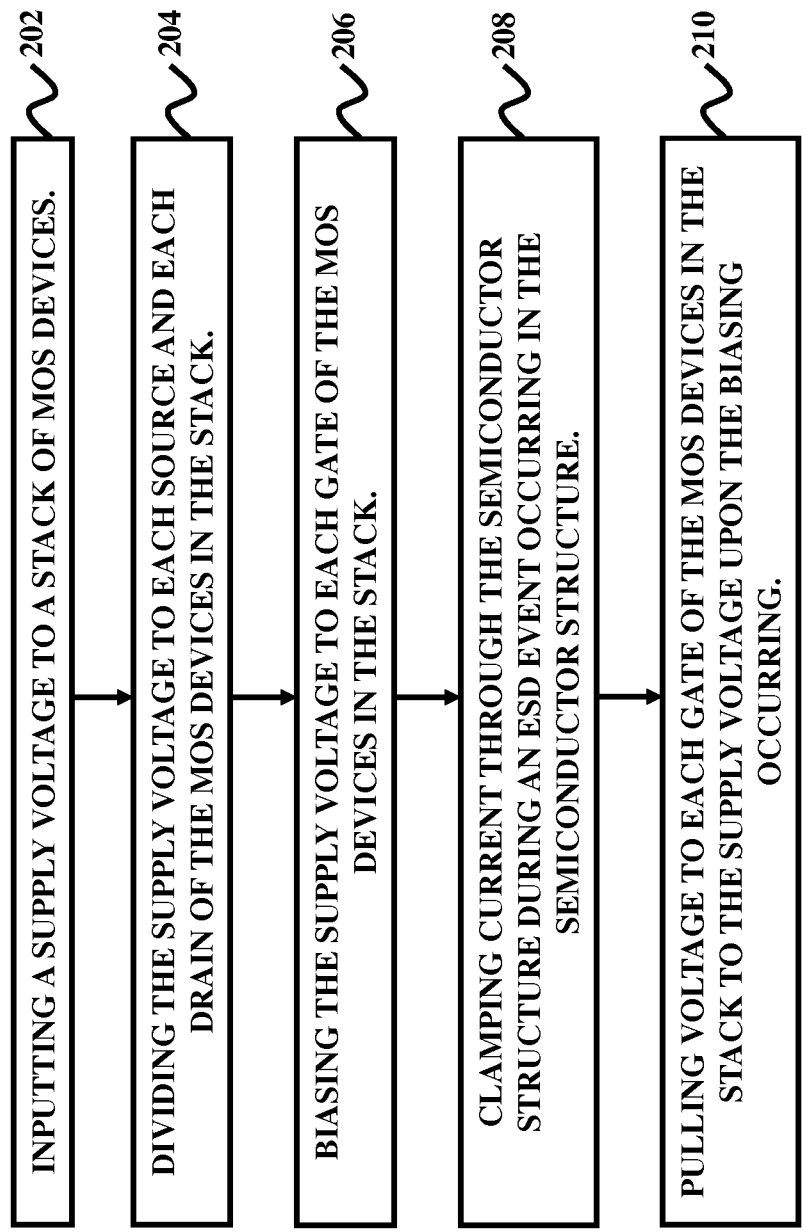
FIG. 4 is a flowchart illustrating a method according to an embodiment herein.

The embodiments herein provide a circuit that provides ESD protection against a positive ESD event using a CMOS device for high DC voltage interface capabilities. Referring now to the drawings, and more particularly to FIGS. 2 through 4, where similar reference characters denote corresponding features consistently throughout the figures, there are shown preferred embodiments.

The embodiments herein provide an ESD clamp circuit 103 that is capable of handling high DC voltages (for example, up to approximately 21 volts DC) and which uses CMOS technology to facilitate more integration and lower the cost of the total solution. FIGS. 2 and 3 illustrate a stacked NMOS ESD clamp 103 using NMOS devices in a N-well configuration with a time lag circuit 109. In FIG. 2 "s" denotes source, "d" denotes drain, and "g" denotes gate in accordance with industry standards. The various numeric values given in FIG. 2 are given as examples only and for illustrative purposes, and the embodiments herein are not limited to the values given in FIG. 2. Those skilled in the art would readily understand using different values corresponding to the voltages given in FIG. 2, for example, based on the particular application and desired result.

In FIG. 2, $M\_1$, $M^2$, $M\_3$, $M\_4$, $M\_5$, and $M\_6$ are all thick oxide devices, which may be configured as 3.3v CMOS thick oxide devices, in one embodiment, and are stacked on top of each other to provide the current clamping function during ESD events. As mentioned the thick oxide devices could be configured as 3.3v CMOS devices or, in other embodiments, could be configured in other sizes (e.g., 5v devices), with the size depending on the technology and device choice. As an example, assuming a 21v supply voltage is input from a voltage source 101 and provided at the drain of $M\_6$, the resistor ladder 105 of Rd's biases the source/drain voltages of $M\_1$ to $M\_6$ to respective voltage levels of 3.5, 7, 10.5, 14, and 17.5 volts. The resistor ladder 107 of Rg's biases the gate voltages $Vg\_1$ to $Vg\_6$ to their respective voltage levels of 0, 3.5, 7, 10.5, 14, and 17.5 volts. As each device $M\_1$ through $M\_6$ has a 0 gate-to-source voltage, which is less than the turn-on threshold voltage of the MOS device (approximately 0.7v), it is evident that no leakage current flows through the ESD clamp 103 during steady state. In this regard, steady state refers to the environment where after an ESD event occurs, the device is functioning under normal operating conditions, which indicates that the supply is a stable DC voltage. All devices $M\_1$ to $M\_6$ shown in FIG. 2 have their drain-to-source voltage (Vds), gate-to-drain voltage (Vgd), gate-to-source voltage (Vgs) as well as source-to-bulk voltage (Vsb) and drain-to-bulk voltage (Vdb) within CMOS technology limits. In this regard, if the thick oxide device that are used are 3.3v capable devices, then 3.5v is the technology limits for the device; if the device is a 5v device, then 6 volt is the technology limit, etc.

For example, $M\_6$ is the device in FIG. 2 that has the highest stress voltage. $M\_6$ has the following stress voltage across its four terminals: Vds=3.5v, Vgd=−3.5v, Vgs=0v, Vdb=10.5v, and Vsb=7v. $M\_5$ has the following stress voltage across its four terminals: Vds=3.5v, Vgd=−3.5v, Vgs=0v, Vdb=7v, and Vsb=3.5v. $M\_4$ has the following stress voltage across its four terminals: Vds=3.5v, Vgd=−3.5v, Vgs=0v, Vdb=3.5v, and Vsb=0v. $M\_3$ has the following stress voltage across its four terminals: Vds=3.5v, Vgd=−3.5v, Vgs=0v, Vdb=3.5v, and Vsb=0v. $M\_2$ has the following stress voltage across its four terminals: Vds=3.5v, Vgd=−3.5v, Vgs=0v, Vdb=7v, and Vsb=3.5v. $M\_1$ has the following stress voltage across its four terminals: Vds=3.5v, Vgd=−3.5v, Vgs=0v, Vdb=3.5v, and Vsb=0v.

In the semiconductor wafer manufacturing industry, the normal CMOS reverse junction breakdown voltage for the N-well to the P substrate is approximately 11v. Thus, in accordance with FIGS. 2 and 3, the ESD clamp 103 provided by the embodiments herein is safe (i.e., and the semiconductor structure 100 attached to the ESD clamp is safe) during a DC condition (i.e., the voltage levels do not change) and does not cause any leakage current because the Vgs level for all of the devices $M\_1$ through $M\_6$ is 0v. During ESD events, however, the resistor 6R and R as well as the capacitor C form a time lag circuit 109 and hold the gate voltage of $M\_{inv}$ inverter device 115 close to ground, thus temporarily turning off the device $M\_{inv}$ 115 and allowing the Cg capacitors 113 to pull the gate voltages of $Vg\_1, \ldots, Vg\_6$ to supply. This temporarily opens the device $M\_1$ to $M\_6$ to form the ground return current path for the ESD clamp 103. The length of time that devices $M\_1$ to $M\_6$ open depends on the time constant of the time lag circuit 109 and the current conducting capability of the ESD clamp 103, which then determines how much ESD charge is returned to ground. The 6R and R divider 111 ensures that during DC conditions, a gate voltage of approximately 3.5v is provided at the gate of the $M\_{inv}$ 115 to turn on the $M\_{inv}$ 115. The diode device Qb is provided as a safe guard device 117 to make sure the gate voltage of $M\_{inv}$ 115 during DC conditions is higher than the MOS turn-on threshold voltage (approximately 0.7v). For example, if the DC supply voltage at the drain of $M\_6$ is less than 5v, then the gate of $M\_{inv}$ 115 is less than 0.7v and thus does disturb the biasing scheme of the overall circuit. However, with the diode Qb, under all conditions, the $M\_{inv}$ 115 turns on at DC.

FIG. 4, with reference to FIGS. 2 and 3, is a flow diagram illustrating a method of controlling ESD in a semiconductor structure 100 according to an embodiment herein. The method comprises providing (200) a stack of MOS devices M_1 through M_6, wherein each of the MOS devices M_1 through M_6 may comprise a source (s), a drain (d), and a gate (g); inputting (202) a supply voltage to the stack of MOS devices M_1 through M_6; dividing (204) the supply voltage to each source (s) and each drain (d) of the MOS devices M_1 through M_6 in the stack; biasing (206) the supply voltage to each gate (g) of the MOS devices M_1 through M_6 in the stack; clamping (208) current through the semiconductor structure 100 during an ESD event occurring in the semiconductor structure 100; and pulling (210) voltage to each gate (g) of the MOS devices M_1 through M_6 in the stack to the supply voltage upon the biasing occurring, wherein no leakage current flows through the stack of MOS devices M_1 through M_6 during steady state. The stack of MOS devices M_1 through M_6 is preferably configured to handle DC voltage levels (e.g., 21v) greater than ESD breakdown levels of the semiconductor structure 100.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. An electrostatic discharge (ESD) circuit comprising:
    a plurality of metal-oxide-semiconductor (MOS) devices arranged in a stack, wherein each of the MOS devices comprises a source, a drain, and a gate;
    a voltage source inputting a supply voltage to the stack of MOS devices;
    a first plurality of resistors equal in number to the number of MOS devices in said stack of MOS devices and configured as a first resistor ladder, wherein each resistor in said first resistor ladder divides said supply voltage to a source and a drain of one MOS device of said plurality of MOS devices in said stack;
    a second plurality of resistors equal in number to the number of MOS devices in said stack of MOS devices and configured as a second resistor ladder, wherein each resistor in said second resistor ladder biases said supply voltage to one gate of one MOS device of said plurality of MOS devices in said stack;
    an inverter device operatively connected to said second plurality of resistors;
    a time lag circuit that turns said inverter device on and off; and
    a plurality of capacitors pulling the voltage to each gate of said MOS devices in said stack to said supply voltage upon said inverter device turning off.

2. The ESD circuit of claim 1, further comprising a diode that keeps a gate voltage of said inverter device higher than a turn-on threshold voltage of said stack of MOS devices.

3. The ESD circuit of claim 1, wherein said time lag circuit holds a voltage to a gate of said inverter device close to ground in order to turn off said inverter device.

4. The ESD circuit of claim 3, wherein said stack of MOS devices opens to form a ground return current path upon said inverter device turning off.

5. The ESD circuit of claim 4, wherein said stack of MOS devices is temporarily opened.

6. The ESD circuit of claim 3, wherein said inverter device is temporarily turned off.

7. The ESD circuit of claim 1, wherein a gate-to-source voltage of each of said MOS devices in said stack is less than a turn-on threshold voltage of the MOS devices.

8. The ESD circuit of claim 7, wherein no leakage current flows through said stack of MOS devices during steady state.

9. The ESD circuit of claim 1, wherein said stack of MOS devices comprise complementary metal-oxide-semiconductor (CMOS) thick oxide devices.

10. An electrostatic discharge (ESD) circuit comprising a stacked metal-oxide-semiconductor (MOS) device having a biasing structure and time lag circuit that provides current clamping during an ESD event and that is configured to handle DC voltage levels greater than ESD breakdown levels of a MOS device, wherein said stacked MOS device comprises a plurality of MOS devices each comprising a source, a drain, and a gate, and wherein said ESD circuit further comprises:
    means for providing a supply voltage to the stacked MOS device;
    a first plurality of resistors equal in number to the number of MOS devices in said stacked MOS device and configured as a first resistor ladder, wherein each resistor in said first resistor ladder divides said supply voltage to a source and a drain of one MOS device of said plurality of MOS devices;
    a second plurality of resistors equal in number to the number of MOS devices in said stacked MOS device and configured as a second resistor ladder, wherein each resistor in said second resistor ladder biases said supply voltage to each of one gate to one MOS device of said plurality of MOS devices;
    an inverter device operatively connected to said second plurality of resistors;
    a time lag circuit that turns said inverter device on and off;
    a plurality of capacitors pulling the voltage to each gate of said MOS devices in said stack to said supply voltage upon said inverter device turning off; and
    a diode that keeps a gate voltage of said inverter device higher than a turn-on threshold voltage of said stack of MOS devices.

11. The ESD circuit of claim 10, wherein said time lag circuit holds a voltage to a gate of said inverter device close to ground in order to turn off said inverter device, and wherein said stack of MOS devices opens to form a ground return current path upon said inverter device turning off.

12. The ESD circuit of claim 11, wherein said inverter device is temporarily turned off, and wherein said stack of MOS devices is temporarily opened.

13. The ESD circuit of claim 10, wherein a gate-to-source voltage of each MOS device in the stacked MOS device is less than a turn-on threshold voltage of the MOS device, and wherein no leakage current flows through said stack of MOS devices during steady state.

14. The ESD circuit of claim 10, wherein said stacked MOS device comprises complementary metal-oxide-semiconductor (CMOS) thick oxide devices.

15. A method of controlling electrostatic discharge (ESD) in a semiconductor structure, said method comprising:
- providing a stack of metal-oxide-semiconductor (MOS) devices, wherein each of the MOS devices comprises a source, a drain, and a gate;
- inputting a supply voltage to said stack of MOS devices;
- dividing said supply voltage to each source and each drain of said MOS devices in said stack with a plurality of resistors forming a first resistor ladder such that each resistor in said first resistor ladder divides said supply voltage to a source and a drain of one MOS device of said plurality of MOS devices;
- biasing said supply voltage to each gate of said MOS devices in said stack with a plurality of resistors forming a second resistor ladder such that each resistor in said second resistor ladder biases said supply voltage to one gate of one MOS device of said plurality of MOS devices;
- clamping current through said semiconductor structure during an ESD event occurring in said semiconductor structure; and
- pulling voltage to each gate of said MOS devices in said stack to said supply voltage upon said biasing occurring,
- wherein no leakage current flows through said stack of MOS devices during steady state.

16. The method of claim 15, wherein said stack of MOS devices is configured to handle DC voltage levels greater than ESD breakdown levels of said semiconductor structure.

* * * * *